US005419036A

United States Patent [19]

Lane et al.

[11] Patent Number: 5,419,036

[45] Date of Patent: May 30, 1995

[54] INSERTION AND BENDING RAM AND METHOD FOR ITS USE

[75] Inventors: Allan S. Lane, Trempealeau, Wis.; Curtis P. Henningson, Winona; Steven T. Beck, Minnesota City, both of Minn.

[73] Assignee: EMD Associates, Inc., Winona, Minn.

[21] Appl. No.: 192,160

[22] Filed: Feb. 4, 1994

[51] Int. Cl.⁶ ........................ H01R 13/41; H05K 13/04

[52] U.S. Cl. ........................ 29/845; 29/564.2; 29/837; 140/147

[58] Field of Search .............. 29/845, 837, 741, 564.2; 140/147

[56] References Cited

U.S. PATENT DOCUMENTS

| | | | |
|---|---|---|---|
| 2,262,901 | 11/1941 | Murphy . | |
| 3,907,008 | 9/1975 | Bates et al. . | |
| 4,165,557 | 8/1979 | Taguchi et al. . | |
| 4,286,379 | 9/1981 | Kawa et al. . | |
| 4,326,613 | 5/1982 | Kirkpatrick | 29/837 |
| 4,464,829 | 8/1984 | Whitley et al. . | |
| 4,467,523 | 8/1994 | Chisholm . | |
| 4,543,713 | 10/1985 | Rapp | 29/741 X |
| 4,557,043 | 12/1985 | Starski . | |
| 4,557,044 | 12/1985 | Crowman et al. . | |
| 4,574,462 | 3/1986 | Jackson . | |
| 4,590,660 | 5/1986 | Starski . | |
| 4,611,399 | 9/1986 | Tavares et al. | 140/147 X |
| 4,719,695 | 1/1988 | Sturner | 29/845 X |
| 4,995,156 | 2/1991 | Pinnavaia . | |
| 5,112,234 | 5/1992 | Johnson et al. | 29/845 X |
| 5,165,165 | 11/1992 | Aoki et al. . | |

OTHER PUBLICATIONS

Autosplice Instruction Manual and Parts List, Autopin/2 OIT, Insertion Head, by Autosplice, Inc., San Deigo Calif. 1993.

*Primary Examiner*—Carl J. Arbes
*Attorney, Agent, or Firm*—Vidas, Arrett & Steinkraus

[57] ABSTRACT

An apparatus and method for first inserting wire pins in a printed circuit board and then bending the pins in progressive die fashion by means of a bending ram. The apparatus consists of an improved insertion and bending ram for use with a pin insertion machine. The improved insertion and bending ram comprises primary and secondary rams held in position by a tooling head, each ram comprising at least two bending notches. The primary ram is designed to first insert the pin vertically into a hole on a printed circuit board. While the primary ram inserts a second pin vertically, a bending notch of the primary ram bends the first pin downward. While the primary ram inserts a third pin vertically, the second pin is bent downward and the first pin is bent so that it contacts the printed circuit board. The primary ram has at least one bending notch. The secondary bending ram functions in the same manner as the primary bending ram but is used to reach pins not bent by the primary bending ram. If there is an interruption or an area of the circuit board is to be skipped, the secondary ram ensures that any pins left vertical or at an intermediate angle the printed circuit board are bent to their normal position in contact with the printed circuit board.

16 Claims, 2 Drawing Sheets

*Fig. 1*
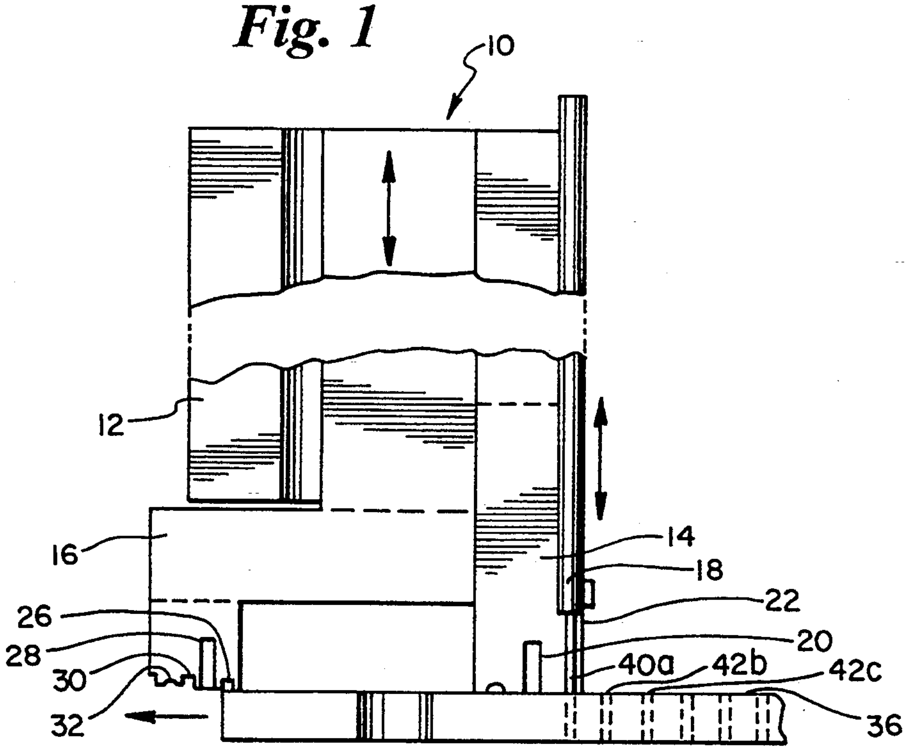
*Fig. 2*
*Fig. 2a*
*Fig. 3a*
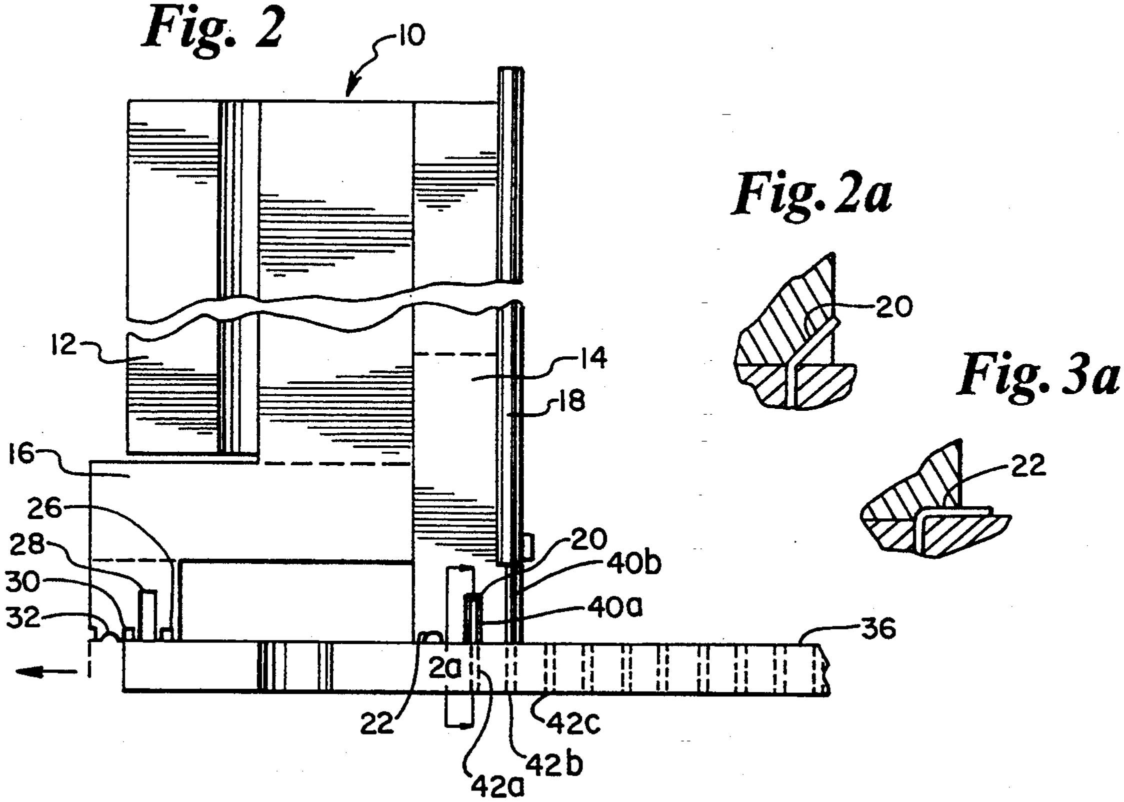

INSERTION AND BENDING RAM AND METHOD FOR ITS USE

FIELD OF THE INVENTION

This invention relates to a method and apparatus for inserting connector terminal pins in a printed circuit board.

BACKGROUND OF THE INVENTION

Prior art methods of inserting terminal pins in a printed circuit board include insertion of pre-bent wires and simultaneously bending all wires in one step after insertion.

Autosplice of San Diego, Calif. produces an automatic pin insertion head which bends the pin prior to insertion, rather than bending the pin after insertion.

U.S. Pat. Nos. 4,807,357 and 4,889,277 to Zahn and assigned to Autosplice disclose methods for inserting a pre-bent pin in one step and for bending a pin by rotating a terminal holder, respectively.

Murphy, U.S. Pat. No. 2,262,901 shows an array of pins which are bent after insertion using a tool which bends all the pins simultaneously. Crowman et al., U.S. Pat. No. 4,557,044 and Aoki et al., U.S. Pat. No. 5,165,165 disclose the bending of pins after insertion of the circuit element into the board.

A need exists for a quick, simple system for inserting and bending terminal pins in two separate operations, which incorporates a secondary ram to finish bending pins when pins are skipped or there is an interruption in the continuity of the primary ram operation.

SUMMARY OF THE INVENTION

The present invention is directed to an apparatus and method of inserting wire pins in a printed circuit board and then bending the pins by means of a bending ram. The apparatus consists of an improved insertion and bending ram for use with a pin insertion machine produced by Autosplice of San Diego, Calif., the Autosplice Autopin/2 ®01T insertion head. The manner in which such a pin insertion machine operates is well known in the art, and is disclosed in *Autosplice® Instruction Manual and Parts List.* AUTOPIN/2 ®01T Insertion Head.

The present invention is an improved bending ram wherein the improvement consists of a bending ram with primary and secondary rams. These bending rams are held in position by the tooling head. The rams first insert, then bend the wire pins in a progressive die fashion. The primary ram is designed to first insert the pin vertically into a hole on a printed circuit board. While the primary ram inserts a second pin vertically, another portion of the primary ram bends the upper portion of the first pin to a predetermined angle with respect to its lower portion. While the primary ram inserts a third pin vertically, the second pin is bent. The primary ram may have the capacity to sequentially bend a pin to intermediate angles prior to bending the pin to its eventual position, in which the upper portion of the pin is at approximately a 90° angle with respect to its lower portion, and the upper portion contacts the surface of the printed circuit board.

The secondary bending ram functions in the same manner as the primary bending ram, but is used to reach pins not bent by the primary bending ram. If there is an interruption or an area of the circuit board is to be skipped, the secondary ram ensures that any pins left vertical or at an angle above the surface of the printed circuit board are bent to their normal 90° angle position.

BRIEF DESCRIPTION OF THE FIGURES

FIG. 1 is a fragmentary side elevational diagram of an insertion and bending ram according to the present invention;

FIG. 2 is a view similar to that of FIG. 1 shown indexed one step;

FIG. 2*a* is a fragmentary section taken along line 2*a*—2*a* in FIG. 2 showing the first bending notch of the primary ram;

FIG. 3*a* is a fragmentary section similar to that of FIG. 2*a*, but showing the second bending notch;

DETAILED DESCRIPTION OF THE INVENTION

Figure 3:
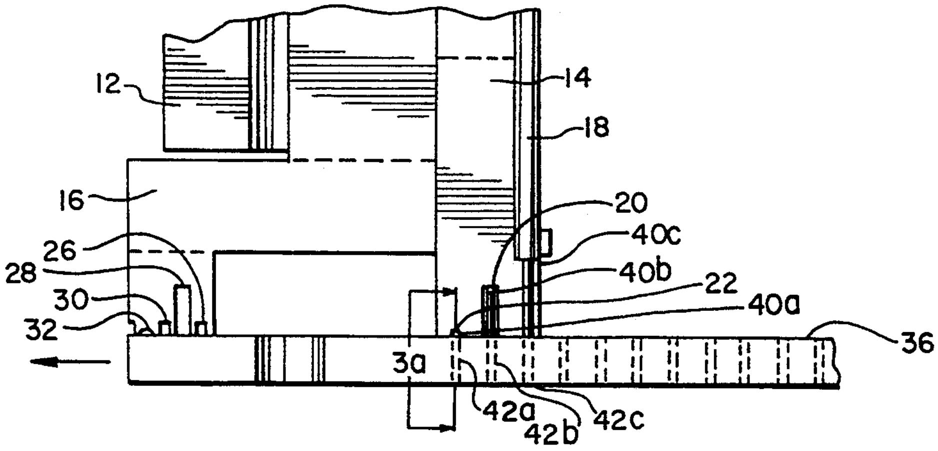
FIG. 3 is a view similar to that of FIGS. 1 and 2 showing the insertion and bending ram indexed a further step.

While this invention may be embodied in many different forms, there are described in detail herein specific preferred embodiments of the invention. This description is an exemplification of the principles of the invention and is not intended to limit the invention to the particular embodiments illustrated.

The present invention is directed to an improved insertion and bending ram and a method of inserting wire pins in a printed circuit board and then bending the pins by means of the inventive bending ram.

The insertion process is well known in the art and is described as follows. The insertion system is comprised of a pin insertion machine and the pin stock. This type of machine is commonly used in the electronic assembly industry. The insertion machine consists of both a tooling head and an X,Y table. The tooling head provides the feeding and tooling mechanisms to insert pins. The tooling inserts the pins in a sequential order into round solder plated through-holes on a printed circuit board. The pins are presented in a continuous roll and are fed by a concentric cam and check pawl system.

The insertion sequence is well known and is ordered as follows. First, a pin is cut and forced, into the clamp portion of the tooling of the pin insertion machine. The pin is bent at this point. The pin is then driven downward and additional material is fed into the cutting area. Next, the pin is driven into the circuit board hole. The tooling then returns to its neutral position.

After the pin is inserted into a hole in the printed circuit board, the X,Y table indexes over for insertion of the next pin. The pin insertion sequence is then repeated. It is important to note that the pins are first bent then inserted by the prior art tooling head. The prior art tooling head inserts the pins into the hole after they are bent.

The improved insertion and bending ram of the present invention enhances the insertion process by eliminating the inconvenient step of bending prior to insertion and adding a bending process in after insertion wherein each pin is individually bent in a multi-step process.

Referring to FIG. 1, the apparatus, shown generally at 10, is an improved insertion and bending ram for use with a pin insertion machine. Although the insertion and bending ram of the present invention may be used with any pin insertion machine, the most preferred is the Autosplice Autopin/2 ®01T insertion head produced by Autosplice of San Diego, Calif. The manner in which such a pin insertion machine operates is well known in the art, and is disclosed in *Autosplice® Instruction Manual and Pans List:* AUTOPIN/2 ®01T Insertion Head. The improved insertion and bending ram 10 includes a tooling head 12, a primary ram 14 and a secondary ram 16. Primary and secondary bending rams 14, 16 are held together and in position by tooling head 12.

Primary ram 14 includes pin insertion means 18, 45° bending notch 20 and 90° bending notch 22. Pin insertion means 18 and 45° bending notch 20 are spaced a predetermined distance apart. This distance is determined by the distance between the pin holes, and is equal to that between 45° bending notch 20 and 90° bending notch 22.

Secondary ram 16 includes first spacer 26, 45° bending notch 28, second spacer 30, and 90° bending notch 32. 45° bending notch 28 and 90° bending notch 32 of secondary ram 16 are spaced a predetermined distance apart, this distance being equal to that between bending notches 20 and 22 of primary ram 14. This distance also coincides with the distance separating the round, soldered equally-spaced through-holes on a printed circuit board 36 on which improved insertion and bending ram 10 is used.

In operation, insertion and bending ram 10 first inserts, then bends wire pins in a progressive die fashion. Although the present invention may be used for any type and size of wire, the most commonly used wire is 0.012" wire. The inserting and bending process is effected through use of an up and down motion generated by the insertion machine.

In use, pin insertion means 18 of primary ram 14 inserts a first pin **40*a* vertically into a first round, soldered through-hole 42*a* on printed circuit board 36. Pin 40*a* is straight before and after insertion into circuit board 36**.

Insertion and bending ram 10 then indexes to the next hole **42*b*. As shown in FIG. 2, while pin insertion means of primary ram 14 vertically inserts a second pin 40*b* into hole 42*b***, *45°* bending notch 20 simultaneously bends pin **40*a* to 45°. 45° bending notch 20 is shown bending pin 40*a* in enlarged detail in FIG. 2*a*. Insertion and bending ram 10 then indexes to the next hole 42*c***.

As shown in FIG. 3, while pin insertion means 18 of primary bending ram 14 inserts a third pin **40*c* vertically, second pin 40*b* is simultaneously bent to 45° by 45° bending notch 20, and first pin 40*a* is simultaneously bent to 90° by 90° bending notch 22. 90° bending notch 22 is shown bending pin 40*a* in enlarged detail in FIG. 3*a***. This operation continues until all desired pins are inserted.

Mechanically, it is not possible for the tooling to descend without intention of insertion. Therefore, some pins are left vertical or partially bent by the primary ram. Because the method of advancing, cutting and forcing the wire pin into the insertion tooling is mechanically uncontrollable, it must occur each time the head ascends from insertion and descends for insertion. Therefore, in the preferred embodiment of the invention as shown, at the end of a sequence of holes in printed circuit board 36 two pins will be left which have not been bent to a position contacting the printed circuit board. To reach all pins, both primary and secondary rams 14, 16 must be used.

Figure 4:
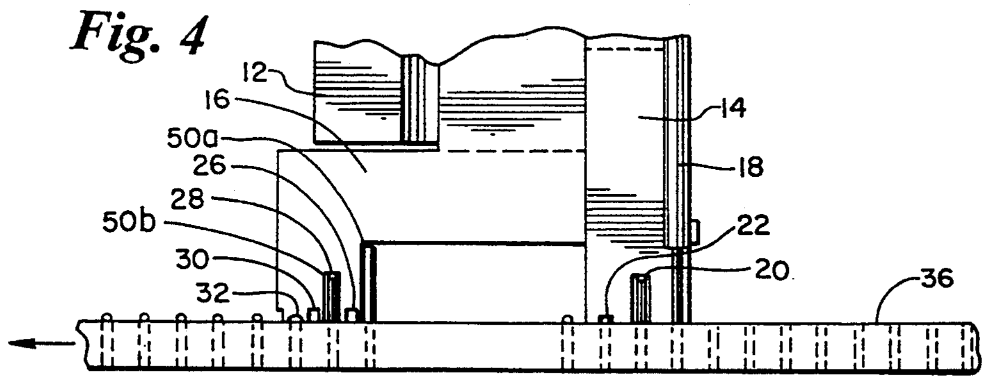
FIG. 4 is a view similar to that of FIG. 3 showing the insertion and bending ram indexed further.
Figure 5:
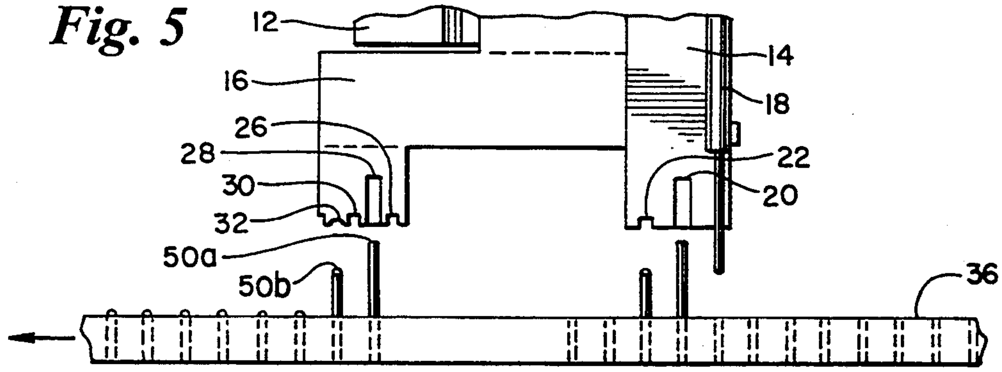
FIG. 5 is a fragmentary side elevational view of the insertion and bending ram while indexing still further.
Figure 6:
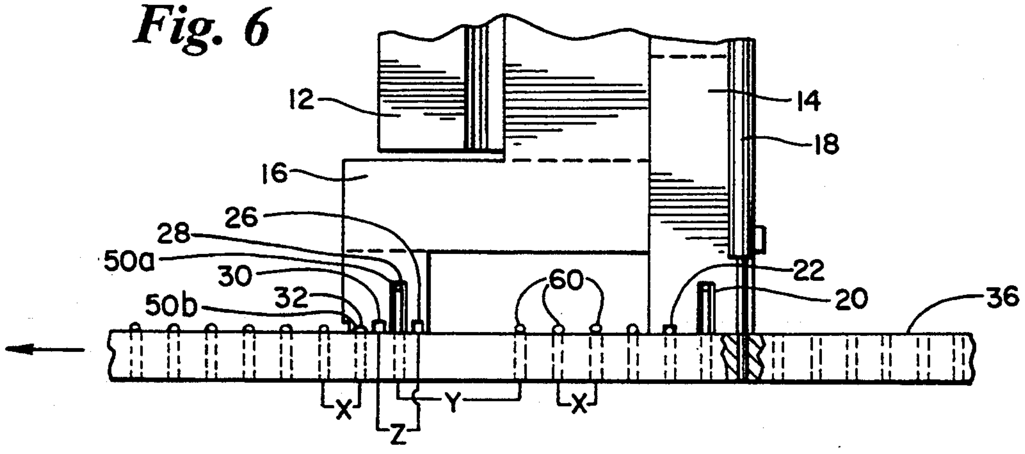
FIG. 6 is a view similar to that of FIG. 4 showing the insertion and bending ram in the position to which it was indexing in FIG. 5.

Secondary bending ram 16 functions in the same manner as primary bending ram 14 but is used to reach pins not bent by primary bending ram 14, as shown in FIGS. 4–6. If there is an interruption or an area of the circuit board 36 is to be skipped, the secondary ram ensures that any pins left vertical or at an intermediate angle are bend to their normal 90° angle position contacting the printed circuit board. Secondary bending ram 16 includes die areas used for both avoidance of pins and alignment of pins which need to be bent.

In FIG. 4, pins **50*a* and 50*b* represent the last pins in a sequence of pins inserted by primary bending ram 14. Pins 50*a* and 50*b* are left vertical and partially bent, respectively by primary bending ram 14, as it is not possible for the insertion and bending ram 10 to descend without intention of insertion. The preferred embodiment shown will leave only two pins which have not been bent to a position contacting printed circuit board 36**, although an embodiment having more than two bending notches will leave more than two pins which have not been bent to a position contacting the circuit board.

Referring again to FIG. 4, pin **50*a* in a vertical position and pin 50*b* which has been bent to an intermediate angle are shown. As secondary ram 16 indexes to the next position, as shown in FIG. 5, it can be seen that pin 50*a* will be bent to an intermediate angle by bending notch 28 and pin 50*b* will be bent to a position contacting circuit board 36 by bending notch 32 as insertion and bending ram 10 continues its descent. FIG. 6 shows the completion of this indexing operation. Although not shown in the figures, the insertion and bending ram will continue to index, and pin 50*a* will be bent by bending notch 32. After the bending of pins 50*a* and 50*b*** is completed, the insertion and bending ram will continue to index.

As primary bending ram 14 continues its insertion and bending sequence, secondary bending ram 16 will index to a point where it will come into contact with pins already inserted and bent by primary bending ram 14. In the improved insertion and bending ram and method of the present invention, the center to center spacing of the area of printed circuit board 36 devoid of round, soldered through-holes, indicated in FIG. 6 by line Y, is not a multiple of the center to center spacing of the through-holes, indicated in FIG. 6 by lines X. Therefore, as primary bending ram 14 indexes to insert pins, the spacing of secondary bending ram 16 will not initially align itself with the through-holes in printed circuit board 36. If relief is not given to particular areas of secondary bending ram 16, secondary ram 16 will contact pins inserted by primary ram 14 and damage them. Spacers 26,30 of secondary bending ram 16, the center to center spacing of which, designated by a line Z, is equal to the center to center spacing of the holes in the printed circuit board, provide clearance to pins designated generally at 60 which have been inserted and bent by primary bending ram 14, thereby preventing them from being damaged by secondary bending ram 14.

The present invention makes it possible not only to easily insert pins in any regularly spaced array of holes in a printed circuit board and bend the pins, but also to easily insert pins into an irregularly spaced spaced array of holes in a printed circuit board and bend the pins. This can be effected through easy dimensional rearrangement of the relationship between the primary and secondary bending rams. Spacers 26,30 function to avoid breakage of pins inserted and bent to a position contacting the printed circuit board by the primary ram, and to facilitate alignment of the secondary ram with the holes in the printed circuit board.

The pins may also be inserted and bent in two operations, or in more than three operations. For instance the pin may be inserted, then bent in one step. An alternative embodiment suited therefor may include one bending notch provided at 90° angle. Additionally, the pin may be inserted, then bent in more than two steps. An alternative embodiment suited therefor may include three bending notches provided at 30°, 60° and 90° angles. A further alternative embodiment may include additional bending notches between and at intermediate angles to the 45° and 90° bending notches. The pin could be bend in any desired number of steps to any desired final angle by easily modifying the disclosed apparatus and method.

The practice of the present invention achieves several objectives and advantages. Other known machinery of this type bends the pins prior to insertion. The inventive tooling, on the other hand, bends the pins after insertion. This is effected through the use of both 45° and 90° bending notches in the primary and secondary rams. The present invention is therefore more precise and more efficient than prior invented bending rams.

The present invention may be adapted to work with any type of pin insertion device, although its most preferred use is with the Autosplice Autopin/2® 01T insertion head.

The present invention has less moving parts than prior art bending rams. Further, the present invention provides an apparatus and method by which the pin is removed from the tooling with no mechanical insult to the pin. The process utilizing the inventive insertion and bending ram provides a highly visual way of controlling the bending process, unlike previous insertion or bending processes, in which it is not possible to determine whether a pin has broken off or the manner in which a pin is bending internally.

The above Examples and disclosure are intended to be illustrative and not exhaustive. These examples and description will suggest many variations and alternatives to one of ordinary skill in this art. All these alternatives and variations are intended to be included within the scope of the attached claims. Those familiar with the art may recognize other equivalents to the specific embodiments described herein which equivalents are also intended to be encompassed by the claims attached hereto.

What is claimed is as follows:

1. A method for inserting a plurality of elongate pin means in sequential order into a plurality of holes in a printed circuit board and bending the elongate pin means in progressive die fashion by means of a pin insertion machine with an improved bending ram, said improved bending ram comprising a tooling head and a primary ram fixed thereto, said primary ram further comprising a pin insertion tooling and a bending notch sequentially positioned on the primary ram a predetermined distance apart, said distance being equal to the distance between the holes in the printed circuit board, said elongate pin means comprising a first end, a second end, a bending point disposed between said ends, and an upper portion and a lower portion separated by said bending point, said method comprising the following steps:

(a) inserting the lower portion of a first elongate pin means into a first hole in the printed circuit board at a predetermined position relative to the printed circuit board by means of the pin insertion tooling;

(b) indexing the bending ram to a second hole in the printed circuit board;

(c) inserting the lower portion of a second elongate pin means into the second hole in the printed circuit board at a predetermined position relative to the printed circuit board by means of the pin insertion tooling and simultaneously contacting the first pin with the bending notch of the primary ram and bending the first elongate pin means at its bending point to a predetermined angle such that the upper portion thereof is angularly disposed with respect to the lower portion thereof;

(d) advancing the bending ram to a third hole in the printed circuit board;

(e) inserting a third elongate pin means into the third hole in the printed circuit board at a predetermined position relative to the printed circuit board by means of the pin insertion tooling, whereby the second elongate pin means is simultaneously contacted by the bending notch of the primary ram and bent its bending point to a predetermined angle such that the upper portion thereof is angularly disposed with respect to the lower portion thereof.

2. A method for inserting a plurality of elongate pin means in sequential order into a plurality of holes in a printed circuit board and bending the elongate pin means in progressive die fashion by means of a pin insertion machine with an improved bending ram, said improved bending ram comprising a tooling head and a primary ram fixed thereto, said primary ram further comprising a pin insertion tooling, a first bending notch and a second bending notch sequentially positioned on the primary ram a predetermined distance apart, said distance being equal to the distance between the holes in the printed circuit board, said elongate pin means comprising a first end, a second end, a bending point disposed between said ends, and an upper portion and a lower portion separated by said bending point, said method comprising the following steps:

(a) inserting the lower portion of a first elongate pin means into a first hole in the printed circuit board at a predetermined position relative to the printed circuit board by means of the pin insertion tooling;

(b) indexing the bending ram to a second hole in the printed circuit board;

(c) inserting the lower portion of a second elongate pin means into the second hole in the printed circuit board at a predetermined position relative to the printed circuit board by means of the pin insertion tooling and simultaneously contacting the first pin with the first bending notch of the primary ram and bending the first elongate pin means at its bending point to a predetermined angle such that the upper portion thereof is angularly disposed with respect to the lower portion thereof;

(d) advancing the bending ram to a third hole in the printed circuit board;

(e) inserting a third elongate pin means into the third hole in the printed circuit board at a predetermined position relative to the printed circuit board by means of the pin insertion tooling, whereby the second elongate pin means is simultaneously contacted by the first bending notch of the primary ram and bent its bending point to a first predetermined angle, and the first pin is simultaneously contacted by the second bending notch of the primary ram and bent to a second predetermined angle.

3. The method of claim 2 wherein the improved bending ram further comprises a secondary bending ram fixedly mounted to said tooling head adjacent to the primary bending ram, said primary and secondary bending rams being held together and in position by said tooling head, said secondary bending ram further comprising a first bending notch and a second bending notch spaced a predetermined distance apart, and the method comprises the further steps of:

(a) indexing the bending ram such that the first bending notch of the secondary ram contacts an elongate pin means which has been inserted but not bent by the primary bending ram and bends the elongate pin means at its bending point to a first predetermined angle, and such that the second bending notch of the secondary ram simultaneously contacts an elongate pin means which has been bent by the first bending notch of the primary ram and bends the elongate pin means to a second predetermined angle;

(b) advancing the bending ram such that the elongate pin means bent by the first bending notch of the secondary ram in the previous step is contacted by the second bending notch of the secondary ram and bent to a second predetermined angle.

4. The method of claim 2 further comprising the steps of:

(a) sequentially advancing the bending ram to a subsequent hole in the series of holes in the printed circuit board into which an elongate pin means is to be inserted;

(b) inserting an elongate pin means into the subsequent hole at a predetermined position relative to the circuit board by means of pin insertion tooling whereby an elongate pins means inserted in the previous step is simultaneously contacted by the first bending notch of the primary ram and bent at its bending point to a first predetermined angle and an elongate pin means bent by the first bending notch in the previous step is simultaneously contacted by the second bending notch of the primary bending ram and bent to a second predetermined angle;

c) repeating steps (a) and (b) a number of times equal to the number of holes remaining into which pins are to be inserted.

5. The method of claim 2 wherein the first predetermined angle defined by the first and second portions of the elongate pin is about 45° and the second predetermined angle defined by the first and second portions of the elongate pin means is about 90°.

6. The method of claim 2 wherein the primary bending ram further comprises a third bending notch disposed a predetermined distance from the second bending notch, the method further comprising the steps of:

a) advancing the bending ram to a fourth hole in the printed circuit board;

b) inserting a fourth elongate pin means into the third hole in the printed circuit board at a predetermined portion relative to the printed circuit board by means of a pin insertion tooling, whereby the third elongate pin means is simultaneously contacted by the first bending notch of the primary ram and bent at its bending point to a first predetermined angle, the second elongate pin means is simultaneously contacted by the second bending notch of the primary ram and bent to a second predetermined angle, and the first elongate pins means is contacted by the third bending notch of the primary ram and bent to a third predetermined angle.

7. The method of claim 6 wherein the first predetermined angle defined by the first and second portions of the elongate pins means is about 30°, the second predetermined angle so defined is about 45°, and the third predetermined angle is defined is about 90°.

8. An improved bending ram for use with a pin insertion machine to insert a plurality of elongate pin means sequential order into a plurality of holes in a printed circuit board and bending the elongate pin means in progressive die fashion, each said elongate pin means comprising a first end, a second end, a bending point disposed between said ends, and an upper portion and a lower portion separated by said bending point, said improved bending ram comprising:

a) a tooling head;

b) a primary ram fixed to said tooling head, said primary ram comprising:

i) a pin insertion tooling for inserting an elongate pin means into a hole in the printed circuit board at a predetermined position relative thereto;

ii) a bending notch for bending an elongate pin means at its bending point to a first predetermined angle, such that the upper portion of said elongate pin means is angularly disposed with respect to the lower portion thereof, said pin insertion tooling and bending notch being sequentially positioned on the tooling ram a predetermined distance apart.

9. An improved bending ram for use with a pin insertion machine to insert a plurality of elongate pin means sequential order into a plurality of holes in a printed circuit board and bending the elongate pin means in progressive die fashion, each said elongate pin means comprising a first end., a second end, a bending point disposed between said ends, and an upper portion and a lower portion separated by said bending point, said improved bending ram comprising:

a) a tooling head;

b) a primary ram fixed to said tooling head, said primary ram comprising:

i) a pin insertion tooling for inserting an elongate pin means into a hole in the printed circuit board at a predetermined position relative thereto;

ii) a first bending notch for bending an elongate pin means at its bending point to a first predetermined angle, such that the upper portion of said elongate pin means is angularly disposed with respect to the lower portion thereof and;

iii) a second bending notch for bending an elongate pin means to a second predetermined angle, said pin insertion tooling, first bending notch and second bending notch being sequentially positioned on the tooling ram a predetermined distance apart.

10. The improved bending ram of claim 9 wherein the first predetermined angle is about 45° and the second predetermined angle is about 90°.

11. The improved bending ram of claim 9 wherein the primary bending ram further includes a third bending notch for bending the elongate pin means to a third predetermined angle.

12. The improved bending ram of claim 11 wherein the first predetermined angle is about 30°, the second predetermined angle is about 60°, and the third predetermined angle is about 90°.

13. The bending ram of claim 9 wherein the predetermined distance between the insertion tooling, the first bending notch and the second bending notch is equal to the distance separating two consecutive holes in the series of holes in the printed. circuit board.

14. The bending ram of claim 9 further comprising a secondary bending ram fixedly mounted to said tooling head adjacent to the primary bending ram, said primary and secondary bending rams being held together and in position by said tooling head, said secondary bending ram comprising:

a) a first bending notch for bending an elongate pin means inserted by the primary bending ram, but not bent thereby at its bending point to a first predetermined angle such that the upper portion of said elongate pin means is angularly disposed relative to the lower portion thereof; and b) a second bending notch for bending an elongate pin means bent to a first predetermined angle by the first bending notch of the primary ram to a second predetermined angle.

15. The improved bending ram of claim 14 wherein the secondary bending ram further includes a third bending notch for bending the elongate pin means to a third predetermined angle.

16. The improved bending ram of claim 15 wherein the first predetermined angle is about 30°, the second predetermined angle is about 60°, and the third predetermined angle is about 90°.

* * * * *